United States Patent [19]
Nath et al.

[11] Patent Number: 5,232,518
[45] Date of Patent: Aug. 3, 1993

[54] PHOTOVOLTAIC ROOF SYSTEM

[75] Inventors: Prem Nath, Rochester Hills; Timothy Laarman, Almont; Avtar Singh, Roseville, all of Mich.

[73] Assignee: United Solar Systems Corporation, Troy, Mich.

[21] Appl. No.: 821,963

[22] Filed: Jan. 16, 1992

Related U.S. Application Data

[63] Continuation-in-part of Ser. No. 620,047, Nov. 30, 1990, Pat. No. 5,092,939.

[51] Int. Cl.⁵ .............................................. H01L 31/04
[52] U.S. Cl. ...................... 136/251; 136/244; 136/291; 52/509
[58] Field of Search ........................ 136/244, 251, 291; 52/173 R, 509

[56] References Cited

U.S. PATENT DOCUMENTS

| | | | |
|---|---|---|---|
| 4,040,867 | 8/1977 | Forestieri et al. | 136/244 |
| 4,189,881 | 2/1980 | Hawley | 52/220 |
| 4,336,413 | 6/1982 | Tourneux | 136/251 |
| 4,636,577 | 1/1987 | Peterpaul | 136/206 |
| 4,773,944 | 9/1988 | Nath et al. | 136/249 |
| 4,860,509 | 8/1989 | Laaly et al. | 52/173 |

*Primary Examiner*—Aaron Weisstuch
*Attorney, Agent, or Firm*—Krass & Young

[57] ABSTRACT

A photovoltaic roofing system includes a plurality of roofing panels each having a photovoltaic device thereupon and each including an electrical connector engageable with a connector on another panel. The panels includes upstanding flanges and a batten and seam roof construction may be readily configured by interconnecting the panels, fastening them to the roof and covering adjoining flanges with the battens.

13 Claims, 5 Drawing Sheets

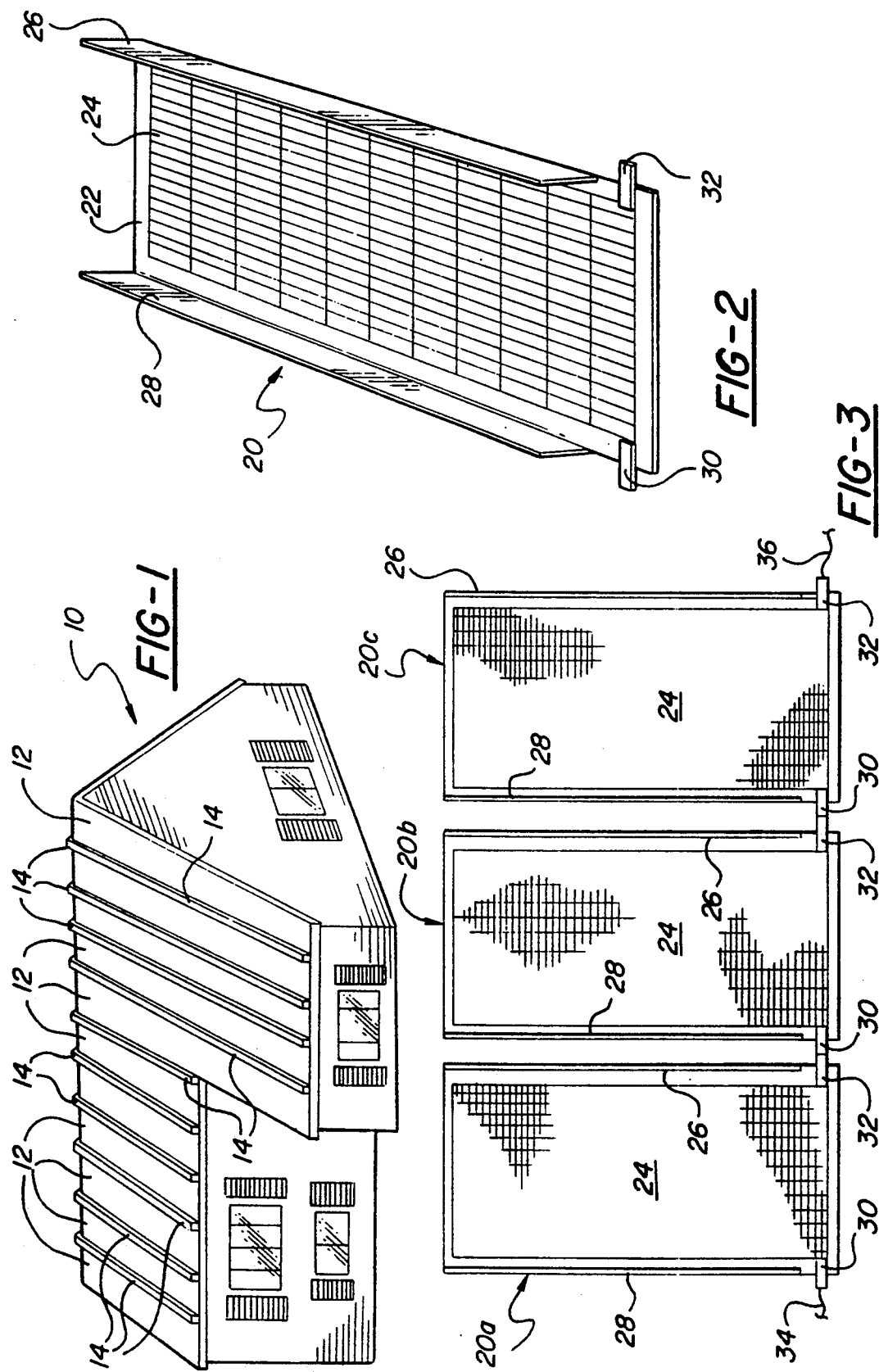

PHOTOVOLTAIC ROOF SYSTEM

REFERENCE TO RELATED APPLICATION

This application is a C.I.P. of U.S. patent application Ser. No. 620,047 filed Nov. 30, 1990 entitled "Photovoltaic Roof and Method of Making Same."

FIELD OF THE INVENTION

The present invention relates generally to photovoltaic devices and more particularly to a roof or building panel structure of the batten and seam type which includes photovoltaic generating devices associated therewith. Most specifically, the invention relates to photovoltaic roofing panels which may be readily connected and disconnected.

BACKGROUND OF THE INVENTION

Photovoltaic energy is becoming very significant source of electrical power. This is due to the fact that problems of scarcity and safety have limited the use of fossil and nuclear fuels and to recent advances in photovoltaic technology which have made possible the large scale manufacture of low cost, lightweight, thin film photovoltaic devices. It is now possible to manufacture large-scale, thin film silicon and/or germanium alloy materials which manifest electrical and optical properties equivalent, and in many instances superior, to their single crystal counterparts. These alloys can be economically deposited at high speed over relatively large areas and in a variety of device configurations and they readily lend themselves to the manufacture of low cost, large area photovoltaic devices. U.S. Pat. Nos. 4,226,898 and 4,217,364 both disclose particular thin film alloys having utility in the manufacture of photovoltaic devices which may be employed in the present invention. However, it is to be understood that the present invention is not limited to any particular class of alloys and may be practiced with a variety of semiconductor materials, including crystalline, polycrystalline, microcrystalline; and non-crystalline materials.

The power generated by a photovoltaic device is proportional to the illumination incident thereupon and if relatively large amounts of power are to be generated, fairly large collection areas are required. The roof and upper story areas of building structures are well illuminated and are generally not productively used. For some time now it has been known to place photovoltaic collectors on the top portions of buildings since the photovoltaic devices are advantageously positioned for illumination; and furthermore, they can function as a roofing structure. Roof mounted photovoltaic panels are shown, for example, in U.S. Pat. No. 4,336,413. U.S. Pat. No. 4,860,509 discloses a roofing material comprised of photovoltaic generating panels disposed in a pliant, waterproof roofing material.

Batten and seam construction is widely used in the building of roofs and the fabrication of wall panels. In this type of construction, a series of panels typically fabricated of metal or the like and having upturned edges, are fastened to a building in a side-by-side relationship so that edges of corresponding panels are disposed in a spaced-apart, parallel relationship. A cap-like batten member is affixed so as to cover adjoining edges and provide a water tight seal. It has been found that batten and seam panels are ideally suited for supporting photovoltaic devices. U.S. Pat. No. 4,189,881 and U.S. patent application 620,047(now U.S. Pat. No. 5,092,939) disclose batten and seam type constructions having photovoltaic devices supported thereupon. As disclosed in the foregoing patents, the panels are placed upon a roof, electrically interconnected and wired into the power system of the building.

It has been found that complications can arise as a result of the interconnections of photovoltaic structures of this type. As shown in the '881 patent, the photovoltaic devices are interconnected by wires running through conduits placed beneath the battens. As disclosed in the patent application 620,047, interconnection between panels is accomplished therebeneath. Both of these arrangements make it difficult to remove panels for replacement or for repair of the underlying roof structure. It is desired that there be provided a batten and seam type of photovoltaic roof construction which is modular in the sense that it allows for ready removal and replacement of individual panels without disturbance to remaining roof structure.

The present invention, as will be more fully disclosed hereinbelow, provides a system of batten and seam type photovoltaic roofs which allows for quick connection and disconnection of roofing panels in various electrically interconnected configurations. The present invention simplifies the installation, use, and service of photovoltaic roofing panels. These and other advantages of the present invention will be readily apparent from the drawings, discussion and description that follow.

BRIEF DESCRIPTION OF THE INVENTION

There is disclosed herein a modular, batten and seam type photovoltaic roofing system which includes a plurality of photovoltaic panels configured to be attached to a roofing structure and further includes a number of batten members each configured to seal a seam between adjoining panels. Each panel includes a base member having a generally planar central portion which is at least partially bounded by two upturned flanges. The panels further include a photovoltaic device disposed on the central portion as well as a positive and negative terminal region associated with the base member. Each panel further includes a first electrical connector disposed in the positive terminal region in electrical communication with an electrical conductor contacting the positive terminal of the photovoltaic device and a second electrical connector disposed in the negative terminal region and in electrical communication with the negative terminal of the photovoltaic device. The connectors are reversibly engageable and include sealing means for providing an environmental seal therebetween when they are engaged. By disposing a first and a second one of said panels on the roof adjacent one another and by interconnecting to the terminals, a photovoltaic roofing structure may be readily assembled.

In particular embodiments of the invention, a coupling member is used to join the connectors of adjacent panels and this coupling member may in some instances be an expansible member. Disclosed herein are particular configurations of connectors and particular terminal orientations.

BRIEF DESCRIPTIONS OF THE DRAWINGS

FIG. 1 is a perspective view of a house showing the photovoltaic roofing system of the present invention affixed thereto;

FIG. 2 is a perspective view of one embodiment of photovoltaic panel structured in accord with the principles of the present invention;

FIG. 3 is a top plan view showing a plurality of the panels of FIG. 2 in an interconnected array;

DETAILED DESCRIPTION OF THE INVENTION

Figure 4:
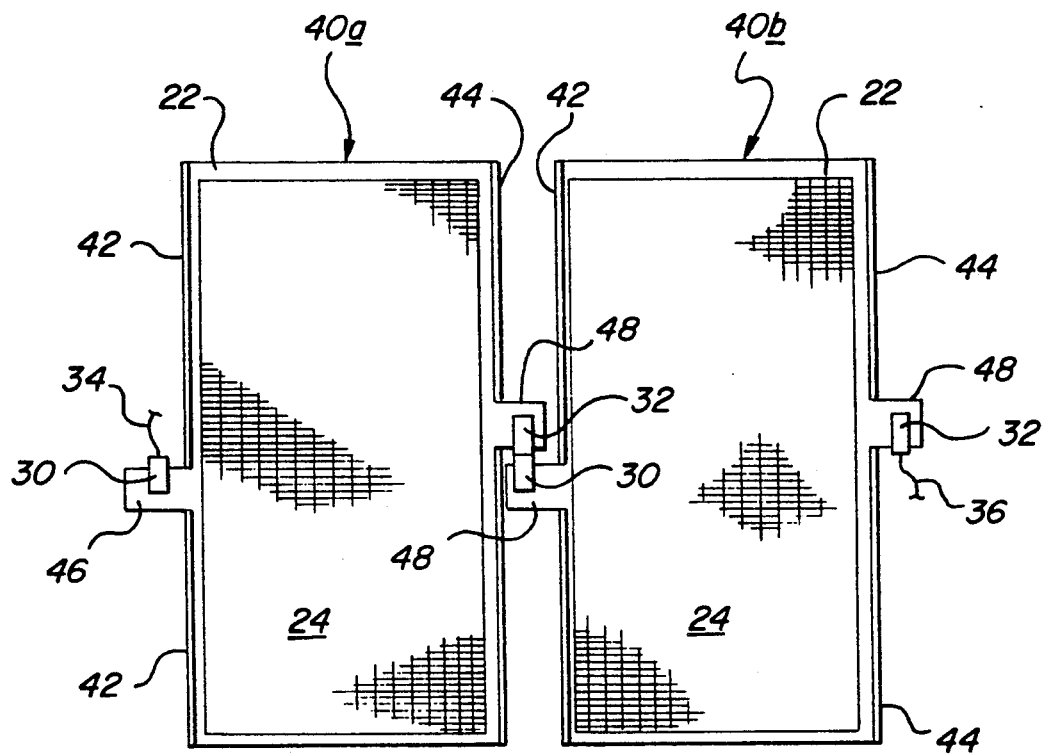
FIG. 4 is a top plan view showing two interconnected panels structured in accord with another embodiment of the present invention.

The present invention is directed to an improved construction of batten and seam type roofs and sheathing panels and FIG. 1 illustrates a house 10 having a roof comprised of a number of photovoltaic panels 12 joined by a member of battens 14 so as to provide an integrated structure which provides environmental protection for the building and which also generates electrical power. It is to be understood that the invention may be similarly disposed to cover vertical surfaces of a building.

Referring now to FIG. 2, there is shown a photovoltaic panel 20 structured in accord with one embodiment of the invention. The panel 20 includes a base member 22 having a generally rectangular central portion with a photovoltaic device 24 disposed thereupon. The central portion is bounded along its long sides by a pair of upturned flanges 26,28 preferably formed by bending a portion of the base member 22 in an upward direction. It will be noted in the FIG. 2 embodiment that the flanges 26,28 do not extend the entire length of the panel. The panel further includes a pair of electrical connectors 30,32 disposed, in this embodiment, at one end of the panel 20. The connectors, as will be described in greater detail hereinbelow, are each located in a terminal region of the base member and are in electrical communication with the photovoltaic device. In the illustrated embodiment, the first connector 30 is in electrical communication with a positive terminal of the photovoltaic device 24 and the second connector 32 is in electrical communication with the negative terminal of the device 24. The structure of the terminals and their interconnection to the photovoltaic device 24 will be described in greater detail hereinbelow.

The base member 22 is fabricated from a material which has sufficient strength, rigidity, and environmental resistance to allow it to function as a batten and seam roofing panel and typically the base member is manufactured from a corrosion-resistant metal such as galvanized steel, aluminum, brass or copper, or it may be fabricated from enameled, painted steel as well as from non-metallic material. The photovoltaic device 24 is not limited to any particular structure and may comprise a crystalline or thin film photovoltaic device. In terms of costs, weight, and flexibility, it is generally preferred to utilize thin film photovoltaic devices in the practice of the present invention. One particularly preferred group of devices comprise those prepared from alloys of silicon, germanium, and combinations thereof. These particular alloys may be readily deposited on a variety of substrates in a roll-to-roll deposition process. Such alloys are disclosed, for example, in U.S. Pat. Nos. 4,226,898 and 4,217,364 as well as in U.S. patent application Ser. No. 620,047, the disclosures of which are incorporated herein by reference. It is also to be understood that other thin film materials such as cadmium sulfide, cadmium telluride, copper indium diselenide, and the like may be employed in the present invention.

Referring now to FIG. 3, there is shown an interconnected array of photovoltaic panels 20a,20b,20c, each generally similar to those of FIG. 2. It will be noted that each panel includes a photovoltaic device 24 as well as upturned flanges 26,28. In the illustrated embodiment, the panels 20a,20b,20c are disposed in an adjoining relationship and electrical communication therebetween is established via the connectors 30,32. Specifically, connector 32 of panel 20a is engaged with connector 30 of panel 20b and connector 32 of panel 20b is engaged with connector 30 of panel 20c. The end connectors 30 of panel 20a and 32 of panel 20c have lead wires 34,36 attached thereto to enable power to be withdrawn from the interconnected array of panels. As illustrated, the panels are interconnected in a series array. By appropriately configuring the connectors on the panels and/or by appropriately interconnecting the panels, it will be appreciated that a parallel or mixed series-parallel array may be similarly configured.

In accord with the present invention, the connectors 30,32 are reversibly engageable and for this reason, panels may be simply removed, replaced or added to an array without extensive rewiring thereof. This is in contrast to previously known photovoltaic batten and seam roof constructions. The connectors, as will be described in greater detail hereinbelow, are environmentally sealed and provide a reliable interconnection.

Various other configurations of panels and interconnections are possible within the scope of the present invention. Referring now to FIG. 4, there is shown an interconnected array comprising two photovoltaic panels 40a,40b. Each of the panels 40a,40b are generally similar to those previously illustrated and toward that end include a photovoltaic device 24 mounted on a base member 22. The base members 22 of the FIG. 4 embodiment include flanges 42,44 which do not run the full length of the long side of the rectangular panels 40a,40b. The panels are configured so that the two tab portions 46,48 project from each panel 40 at an approximate mid point thereof. These tabs 46,48 comprise the terminal regions of the panels 40 and each includes a connector 30,32 generally similar to those previously described. It will be noted that the two tabs 46,48 of each panel 40 are slightly offset with regard to one another so as to facilitate a side by side interconnection of adjacent panels as shown. It has been found that disposal of the terminal regions and connectors as illustrated increases the overall efficiency of the array somewhat since photogenerated current has, on the average, a shorter path to traverse through the relatively high resistivity portion of the photovoltaic device 24 before reaching the connectors 30,32.

Figure 9:
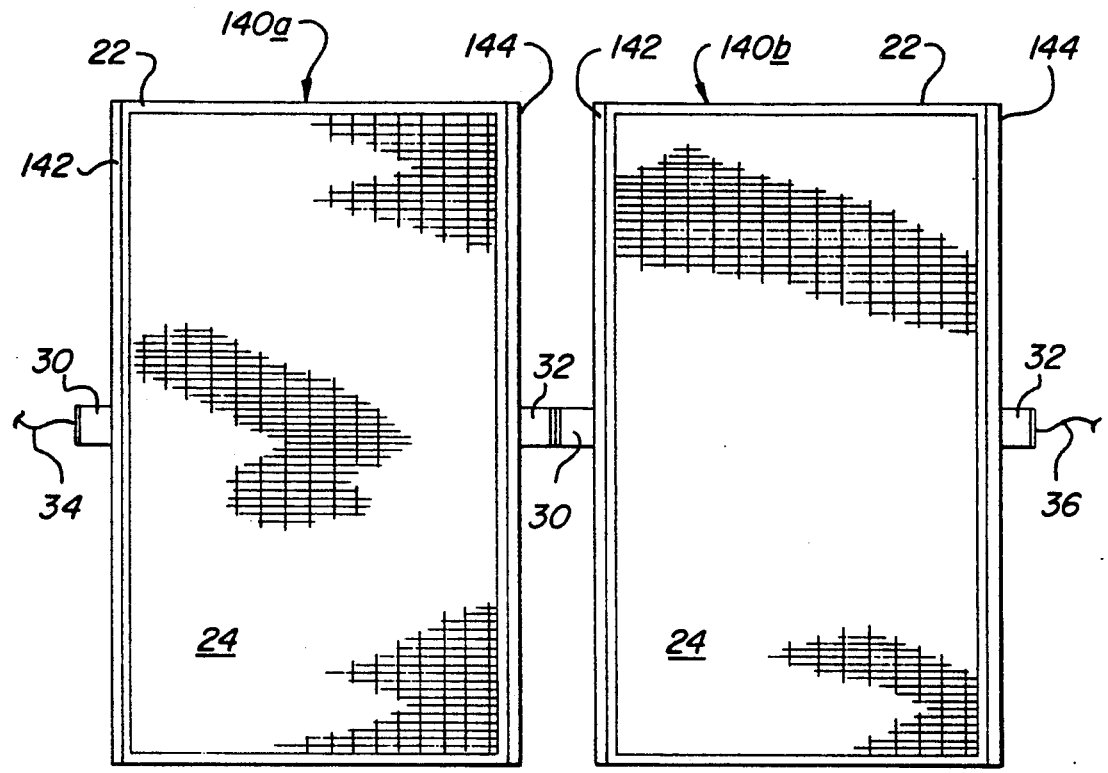
FIG. 9 is a top plan view showing two interconnected panels structured in accord with yet another embodiment of the present invention.
Figures 10A, 10B:
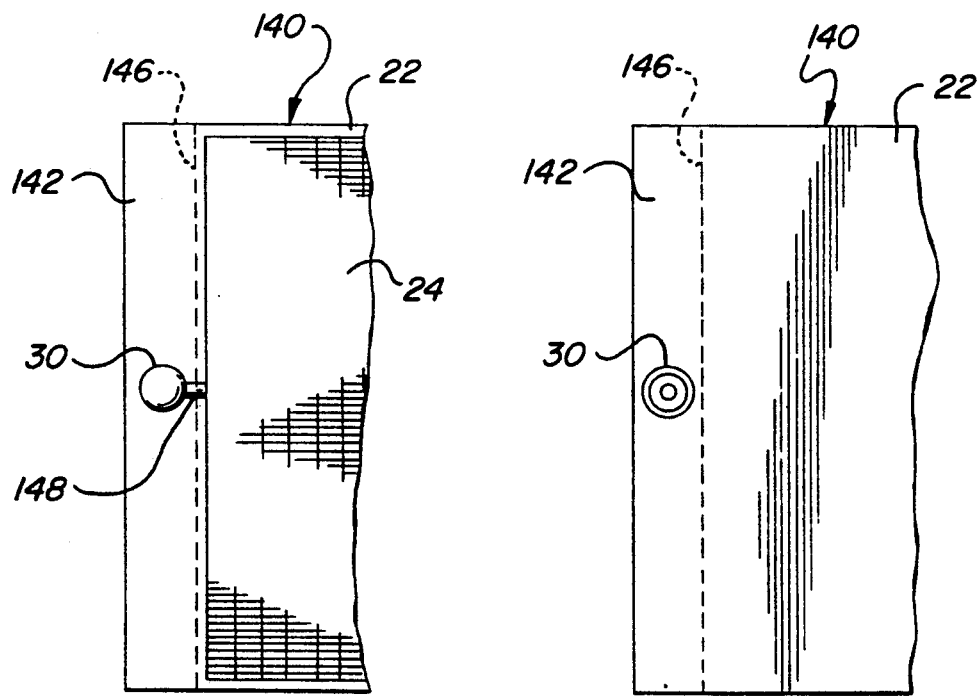
FIG. 10A is a top plan view of a portion of a photovoltaic panel of the FIG. 9 embodiment prior to the flange thereof being bent into an upturned position.
FIG. 10B is a bottom plan view of the portion of the photovoltaic panel of FIG. 10A.

Referring now to FIGS. 9, 10A, and 10B, yet another configuration of panel structured in accord with the principles of the present invention is illustrated. Referring specifically to FIG. 9, there is shown a pair of interconnected panels 140a,140b. Each of the panels 140a,140b are generally similar to those previously illustrated and toward that end include a photovoltaic device 24 mounted on a base member 22. The base member 22 of the FIG. 9 embodiment include flanges 142 and 144 which run the full length of each of the panels 140a and 140b. It has been found that in some instances such continuous flanges provide enhanced stability to the panels.

In the FIG. 9 embodiment, the flanges 142 and 144 each provide the positive and negative terminal regions of the panels 140a,140b thereupon and toward that end, each flange 142,144 includes a connector 30,32 associated therewith. These connectors are generally similar to those previously described and as noted hereinabove may comprise a wide variety of sealable connectors. As depicted in FIG. 9, the connectors 30 and 32 may also include a pigtail lead 34,36 for connection of the panel array to a load device.

Since the flanges 142,144 are continuous along the length of the panel 140, the connector associated therewith must pass through the flange to establish connection with the photovoltaic device 24.

Referring now to FIGS. 10A and 10B, there is shown a portion of a panel 140 generally similar to those described in FIG. 9 depicting a flange 142 and connector 30 associated therewith. Specifically referring to FIG. 10A, there is shown a top plan view of a portion of the panel 140 illustrating the base member 22 with a photovoltaic device 24 affixed thereto. A portion of the base member 22 will subsequently be bent up along the dashed line 146 to form a flange 142. The photovoltaic device 24 has an electrically conductive tab 148 associated with one of the electrodes thereof. This tab 148 is in electrical communication with a connector 30. Since the flange 142 is continuous, an opening therethrough must be provided to allow the connector 30 to establish electrical connection to an adjoining panel. Referring now to FIG. 10B, there is shown a bottom plan view of the portion of the panel 90 of FIG. 10A depicting the flange 142, bend line 146 and connector 30. It is to be understood that the FIG. 10 embodiment will also include a corresponding connector (for example, connector 32 in the previous figures) at the opposite flange thereof. The choice of connectors and placement may be varied within the scope of the present invention and it is to be understood that in some instances two connectors may be placed on a single flange and in some instances, a panel may include multiple positive and negative connectors disposed in various locations to allow for various mechanical and electrical interconnections. For example, by appropriately placing positive and negative connectors, a series of panels may be provided which may be selectively interconnected in series or in parallel arrangements. All of such variations are within the scope of the invention.

Figure 5:
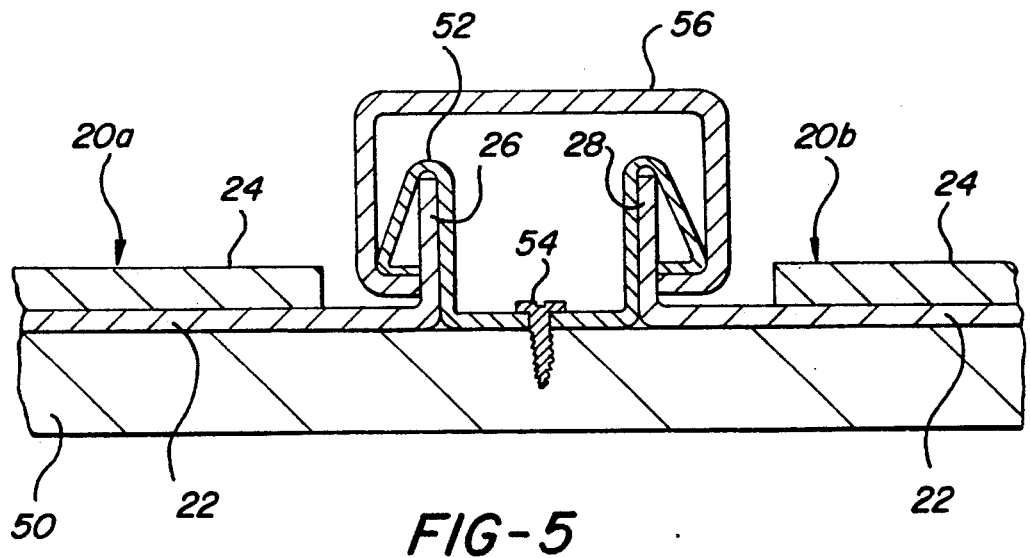
FIG. 5 is a cross-sectional view of two panels showing the disposition of the batten.

Referring now to FIG. 5, there is a portion of a roof top assembly showing an illustration of the general manner in which the panels of the present invention are affixed to a subjacent structure. As shown in cross section, photovoltaic panels 20a,20b generally similar to those previously illustrated are affixed to a roof structure 50. The panels 20a,20b include a base member 22 having a photovoltaic device 24 disposed thereon and the base member includes turned-up flanges 26,28 and as illustrated, the flanges 26,28 are engaged by a clip 52 which is affixed to the roof 50 by means of a screw 54. The clip 52 engages the flanges 26,28 and retains the panels 20 on the roof. The clip additionally functions to retain a batten 56 and the completed arrangement provides an aesthetically pleasing, weather-tight roofing structure. The batten 56 and flanges 26,28 cooperate to provide an enclosed space which will preferably house and protect the connectors of adjoining cells.

Figure 6A:
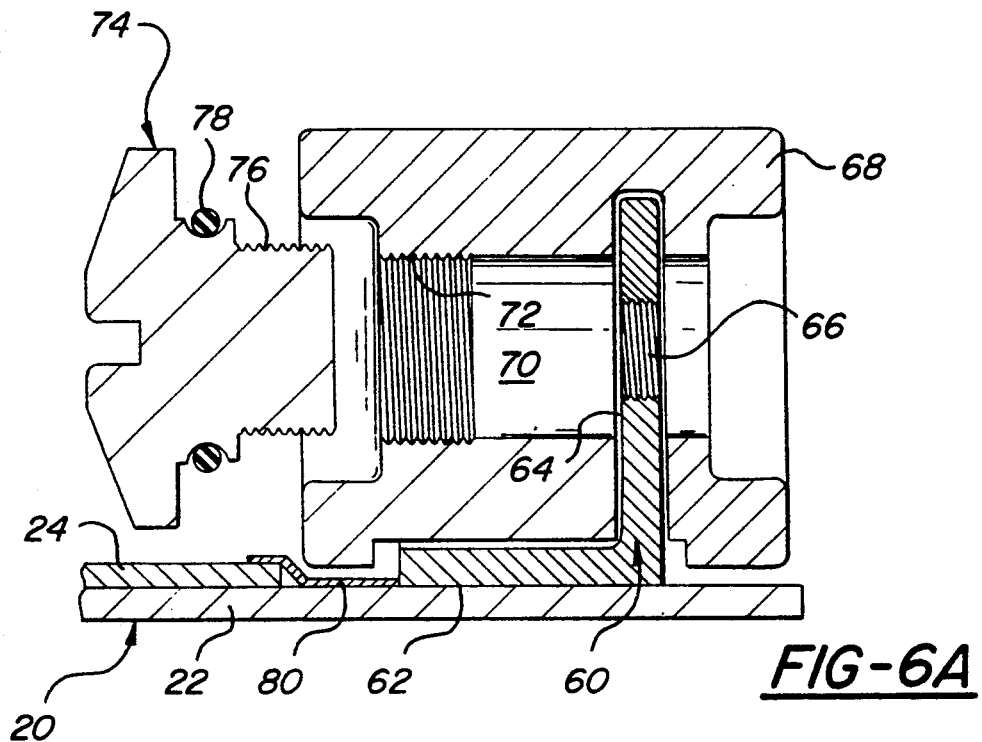
FIG. 6A is cross-sectional view illustrating a connector and end cap structured in accord with the principles of the present invention as attached to a photovoltaic panel.
Figure 6B:
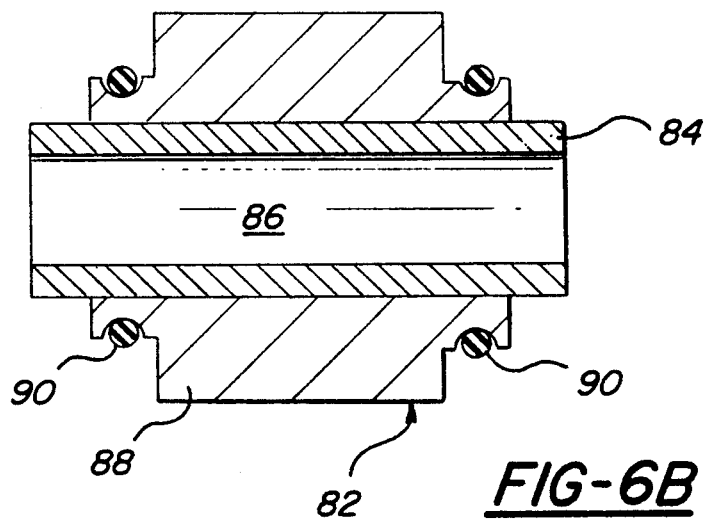
FIG. 6B is a cross-sectional view of a coupler which may be used in connection with the connector of FIG. 6A.
Figure 6C:
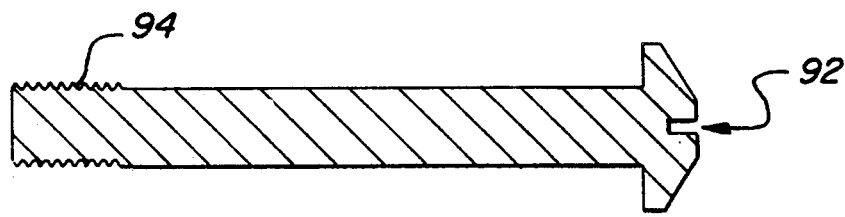
FIG. 6C is a cross-sectional view of an attachment screw which may be used in connection with the connector of 6A and the coupler of 6B.

There are a variety of connectors which may be employed in the present invention, provided such connectors allow for the ready connection and disconnection of adjoining cells and it is preferable that such connectors be of low electrical resistivity and include environmental sealing means to preserve the integrity of the connection. Referring now to FIG. 6A-6C, there is shown one particular configuration of connector which may be advantageously employed in the present invention.

FIG. 6A illustrates, in cross section, a portion of a photovoltaic panel 20 having a particular configuration of connector thereupon. As illustrated, the panel 20 includes a base member 22 with a photovoltaic device 24 disposed thereupon. The connector includes an L-shaped metallic member 60 having a base leg 62 which may be affixed by means of solder, a bolt, a rivet or similar means (not shown) to the terminal region of the panel 20. The L-shaped member further includes a connector leg 64 angularly disposed in relationship to the base leg 62. The connector leg 64 includes an opening, in this instance a threaded opening 66, defined therethrough.

The connector further includes a housing 68 preferably fabricated from an electrically-insulating, moisture-impervious material which encloses the L-shaped metallic member 60. The housing 68 includes a passageway 70 therethrough which is in general alignment with the opening 66 in the connector leg 64. As illustrated, a portion of the passageway 70 includes screw threads 72 formed thereupon and the connector further includes an end cap 74 which is configured to seal one end of the passageway 70 in the housing 68. The cap 74 includes a threaded portion 76 which engages the screw threads 72 in the passage 70 and further includes an O-ring 78 to complete a moisture-proof seal.

The connector is mounted on the base member 22 as previously noted and is in electrical communication with an electrical conductor 80, which conductor is in communication with one of the terminals of the photovoltaic device 24. In this manner, the connector electrically communicates with the photovoltaic device. It will be appreciated that by appropriately positioning the conductor 80, the connector may be put into electrical communication with the other terminal of the photovoltaic device 24. The housing 68 and end cap of the connector are preferably manufactured from a polymeric material such as polycarbonate, high density polyethylene, nylon, ABS, or similar materials. The L-shaped member 60 is preferably manufactured from a metal having good electrical conductivity such as copper, aluminum, brass, or steel.

The connector of FIG. 6A is preferably used in conjunction with a coupling member and one such coupling member 82 is illustrated in FIG. 6B. The coupling member 82 of FIG. 6B includes generally cylindrical electrical conductor 84 having a passageway 86 defined therethrough. Surrounding a portion of the cylindrical conductor 84 is a housing 88 fabricated from an electrically-resistive, moisture-impervious material generally similar to that of the housing 68 of the connector illustrated in FIG. 6A. The coupling member 82 further includes a pair of O-rings 90 at either end thereof. It will be noted that the coupling member 82 is configured to fit into one end of the housing 68 of the FIG. 6A connector so that the end of the cylindrical conductor 84 will contact the connector leg 64 thereof. In use, the coupling member 82 is also fitted into a second connector also generally similar to that of FIG. 6A. In this manner, the cylindrical conductor 84 of the coupling member 82 completes an electrical circuit between the two connector legs of the two terminals and hence between the two photovoltaic devices joined thereto.

To ensure the integrity of the joint formed thereby, a screw, generally similar to the screw 92 illustrated in FIG. 6B is employed. The screw 92 is of sufficient length to pass through the holes 66 in the connector leg 64 of a first connector, through the passage 86 in the coupling member 82 and into the hole 66 of the second connector. In the illustrated embodiment, the end portion 94 of the bolt 92 is threaded to engage corresponding screw threads in the connector leg 64; although, it is to be understood that a nut, cam-lock or other fastening arrangement may be similarly employed.

In order to install a photovoltaic roof using the connection hardware of FIGS. 6A-C, a pair of photovoltaic panels are placed on a roof in an adjacent relationship, the connectors of adjoining panels are united with a coupling member and the screw is passed through to affix the units in a rigid, electrically interconnected relationship. The end caps are fitted onto the connectors to seal the connection and the panels are fastened to the roof and capped with the batten. Disassembly follows the reverse pattern.

It is to be understood that connectors other than those illustrated herein may be similarly employed. In some instances, it has been found that this assembly of a connected unit is facilitated if the coupling member is an expansible member, that is to say, a member which is capable of changing its length. An expansible member will allow for easier installation and removal of adjoining panels.

Figure 7:
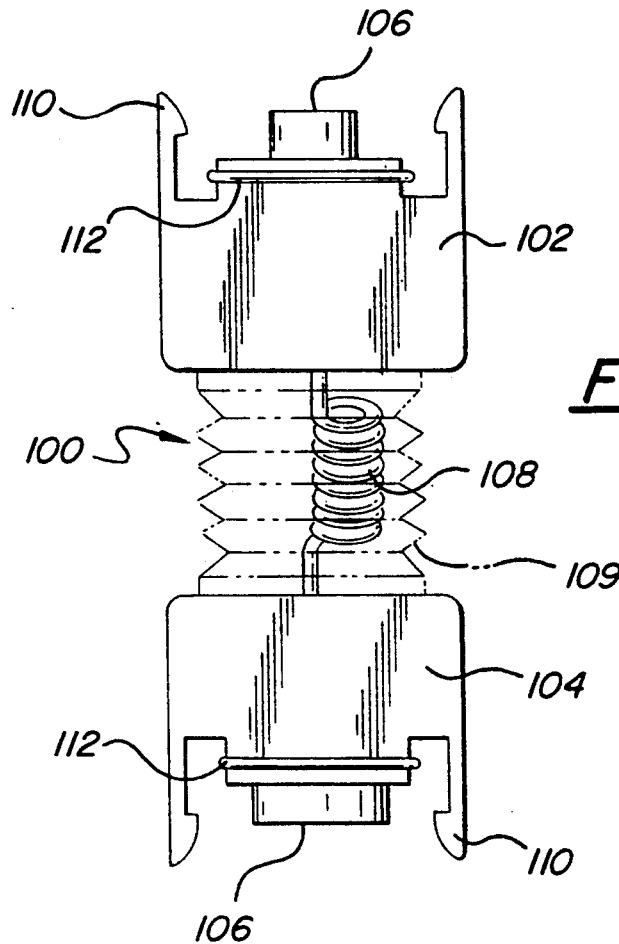
FIG. 7 is a top plan view of an expansible connector which may be used in the present invention.

Referring now to FIG. 7, there is shown one embodiment of expansible coupling member 100. This member includes two connector portions 102,104, each having an electrical conductor 106 associated therewith. The conductor 106 engages a conductor portion of a connector on a given panel and thus establishes electrical communication with the photovoltaic device. The two portions 102,104 are interconnected by an electrically conductive wire 108 which establishes electrical communication between the two conductors 106. As illustrated, the expansible coupling member 100 includes integral latches 110 which engage corresponding members on the connectors. Obviously, other attachments may be similarly employed. Also, as illustrated, the coupling member 100 includes O-rings 112 associated therewith for sealing the joints with the connectors. The expansible coupling 100 may optionally include a flexible boot which protects the wire 108. This boot is shown in phantom outline at 109.

Figure 8:
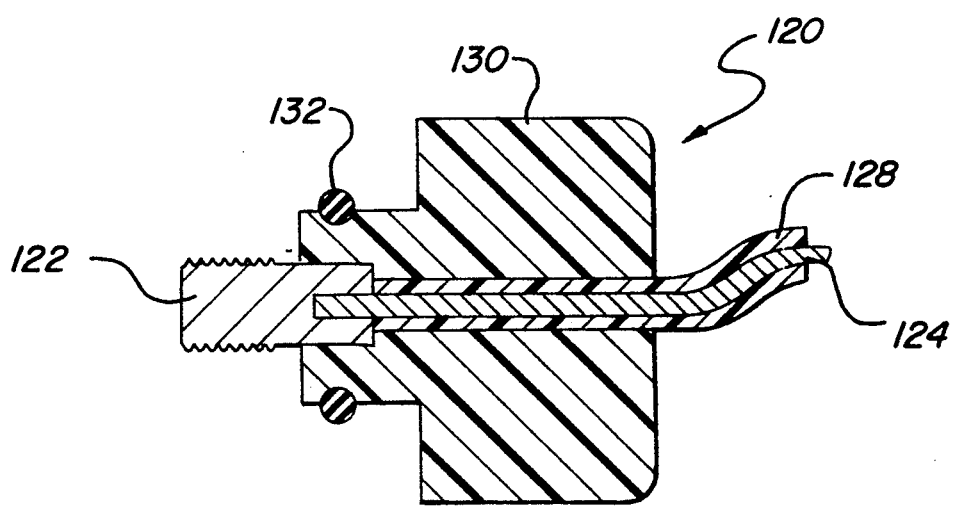
FIG. 8 is a cross-sectional view of a lead fitting which may be used in the present invention.

The first and last photovoltaic panel in any group of interconnected panels will electrically communicate with the load being energized, and toward that end, it is preferable that there be included some means for attaching an electrical lead to the panel. Illustrated in FIG. 8 is a lead fitting 120 which is configured to engage a connector generally similar to that shown in FIG. 6A. The lead fitting 120 includes a screw-threaded, electrically-conductive member 122 configured to engage the screw threads in the connector leg 64 of the FIG. 6A connector. Affixed in electrical communication with the conductive member 122 is a current-carrying wire 124 which has an electrically-insulting sheath 128 associated therewith. The electrically-conductive member 122 and wire 124 are retained within an electrically-insulating housing 130 which, in this embodiment, further includes an O-ring 132 disposed so as to seal the connection. Clearly, the particular design of lead fitting employed in a given application will depend upon the design of the conductor used.

It is to be appreciated that the present invention may be practiced other than specifically illustrated herein. For example, there are a number of other connector configurations which may be adapted to the present invention. Any connector employed should be capable of carrying relatively high levels of electrical current, be simple to connect and disconnect, and provide adequate protection from the external environment. Various commercially available connectors, such as those sold by the Amphenol and Packard Corporations may be readily adapted for use in the present invention. The terminal portions of the panels may be disposed other than as is illustrated herein and a variety of photovoltaic devices may be employed in connection with the present invention.

In view of the foregoing, it will be appreciated that the drawings, discussion and description contained herein is illustrative of particular embodiment of the present invention is not a limitation upon the practice thereof. It is the following claims, including all equivalents, which define the scope of the invention.

We claim:

1. A modular batten and seam type photovoltaic roofing system comprising:
   I) a plurality of photovoltaic panels, each panel including:
   a base member having a generally planar central portion at least partially bounded by two upturned flanges;
   a photovoltaic device disposed on said central portion, said device including a positive terminal and a negative terminal;
   a positive terminal region associated with said base member and including a first electrical conductor in electrical communication with the positive terminal of said photovoltaic device;
   a negative terminal region associated with said base member and including a second electrical conductor in electrical communication with the negative terminal of said photovoltaic device;
   a first electrical connector affixed to said positive terminal region, in electrical communication with said first electrical conductor;

a second electrical conductor affixed to said negative terminal region, in electrical communication with said second electrical conductor;

said roofing system further including:

II) a coupling member having a first end reversibly attachable to one of said electrical connectors on a first one of said plurality of panels and a second end reversibly attachable to one of said electrical connectors on a second one of said panels, said coupling member being operable to establish electrical communication between said first and second panels;

III) a plurality of batten members, each configured to cover one upturned flange of each of two of said plurality of panels, when said two panels are adjacently disposed on a roof.

2. A system as in claim 1, wherein said coupling member is expansible.

3. A system as in claim 1, wherein:

said first and second conductors are generally L-shaped metallic members including a base leg configured to be affixable to a respective terminal region of said panel and a connector leg angularly disposed with regard to the base leg and including a hole defined therethrough;

said connector includes a connector housing which is made of an electrically insulating, moisture impervious material and which is configured to enclose the connector leg, said housing including a passageway defined therethrough generally aligned with the hole in the connector leg;

said coupling member includes an elongated electrical conductor having a passage defined therethrough and further includes a coupling housing surrounding a portion of the length of the elongated conductor so that a portion thereof projects from either end of said coupling housing, said connector housing and coupling housing configured so that the elongated conductor contacts the coupling leg of the connector of the first one of said panels when engaged therewith and the coupling leg of the second one of said panels when engaged therewith so that the passageway through said elongated conductor aligns with the holes defined in said connector legs, said system further including:

a fastener configured to pass through the passage in the elongated conductor and the holes in the connector legs and operable to retain the legs and the elongated conductor in engagement.

4. A system as in claim 1, which further includes an O-ring disposed so as to provide a seal between the coupling member and one of the connectors.

5. A system as in claim 1, wherein the central portion of said base member is generally rectangular and one of said upturned flanges is disposed along each long edge thereof.

6. A system as in claim 5, wherein said positive terminal region and said negative terminal region are each disposed on opposite edges of said central portion and proximate an end of said panel.

7. A system as in claim 5, wherein said positive terminal region and negative terminal region are each disposed along opposite edges of said central portion and intermediate of the ends of said panel.

8. A system as in claim 7, wherein said terminal regions are asymmetrically disposed.

9. A system as in claim 5, wherein said terminal regions comprise tabs projecting from the central portion of the base member in a coplanar relationship therewith.

10. A system as in claim 1, wherein said photovoltaic device is a thin film photovoltaic device.

11. A system as in claim 10, wherein said photovoltaic device includes a semiconductor alloy material including a member selected from the group consisting of silicon, germanium, and combinations thereof.

12. A system as in claim 1, wherein each of said batten members is further configured to cover an electrical connector of each of said two adjacently disposed panels.

13. A system as in claim 1, wherein said positive terminal region is disposed upon a first one of said upturned flanges and said negative terminal region is disposed upon a second one of said upturned flanges.

* * * * *

UNITED STATES PATENT AND TRADEMARK OFFICE
CERTIFICATE OF CORRECTION

PATENT NO. : 5,232,518
DATED : 08/03/93
INVENTOR(S) : Prem Nath et. al.

It is certified that error appears in the above-identified patent and that said Letters Patent is hereby corrected as shown below:

Column 9, Line 1, Delete "conductor" Insert --connector--

Signed and Sealed this

Twenty-ninth Day of March, 1994

*Attest:*

BRUCE LEHMAN

*Attesting Officer*     *Commissioner of Patents and Trademarks*